United States Patent [19]

Vyas

[11] Patent Number: 5,348,686
[45] Date of Patent: Sep. 20, 1994

[54] ELECTRICALLY CONDUCTIVE GEL

[75] Inventor: Navin N. Vyas, Winston-Salem, N.C.

[73] Assignee: The Whitaker Corporation, Wilmington, Del.

[21] Appl. No.: 123,595

[22] Filed: Sep. 20, 1993

Related U.S. Application Data

[63] Continuation of Ser. No. 902,255, Jun. 22, 1992, abandoned.

[51] Int. Cl.[5] .................... H01B 1/00; H01B 1/20; H01B1/22
[52] U.S. Cl. ...................... 252/514; 252/512; 525/474; 528/10; 528/12; 528/32; 528/34
[58] Field of Search ............. 252/512, 514, 518, 502, 252/510; 525/474; 528/10, 12, 32, 34

[56] References Cited

U.S. PATENT DOCUMENTS

| | | | |
|---|---|---|---|
| 4,140,461 | 2/1979 | Wiley et al. | 425/174 |
| 4,406,827 | 9/1983 | Carim | 252/518 |
| 4,770,641 | 9/1988 | Rowlette | 439/86 |
| 4,777,205 | 10/1988 | La Scola et al. | 252/514 |
| 4,845,457 | 7/1989 | Nakanishi | 338/114 |
| 5,037,312 | 8/1991 | Casciotti et al. | 439/66 |
| 5,074,799 | 12/1991 | Rowlette, Sr. | 439/91 |
| 5,075,038 | 12/1991 | Cole et al. | 252/514 |
| 5,108,791 | 4/1992 | Chung et al. | 427/208.8 |

Primary Examiner—Paul Lieberman
Assistant Examiner—M. Kopec
Attorney, Agent, or Firm—William B. Noll

[57] ABSTRACT

The invention relates to an electrically conductive silicone gel having a combination of conductive particles comprising silver coated mica and oxide free silver flakes uniformly dispersed therethrough, where said gel is characterized as non-flowing, self-healing, and thermally stable, with a volume resistivity of less than about 2.0 milliohm-cm.

7 Claims, 1 Drawing Sheet

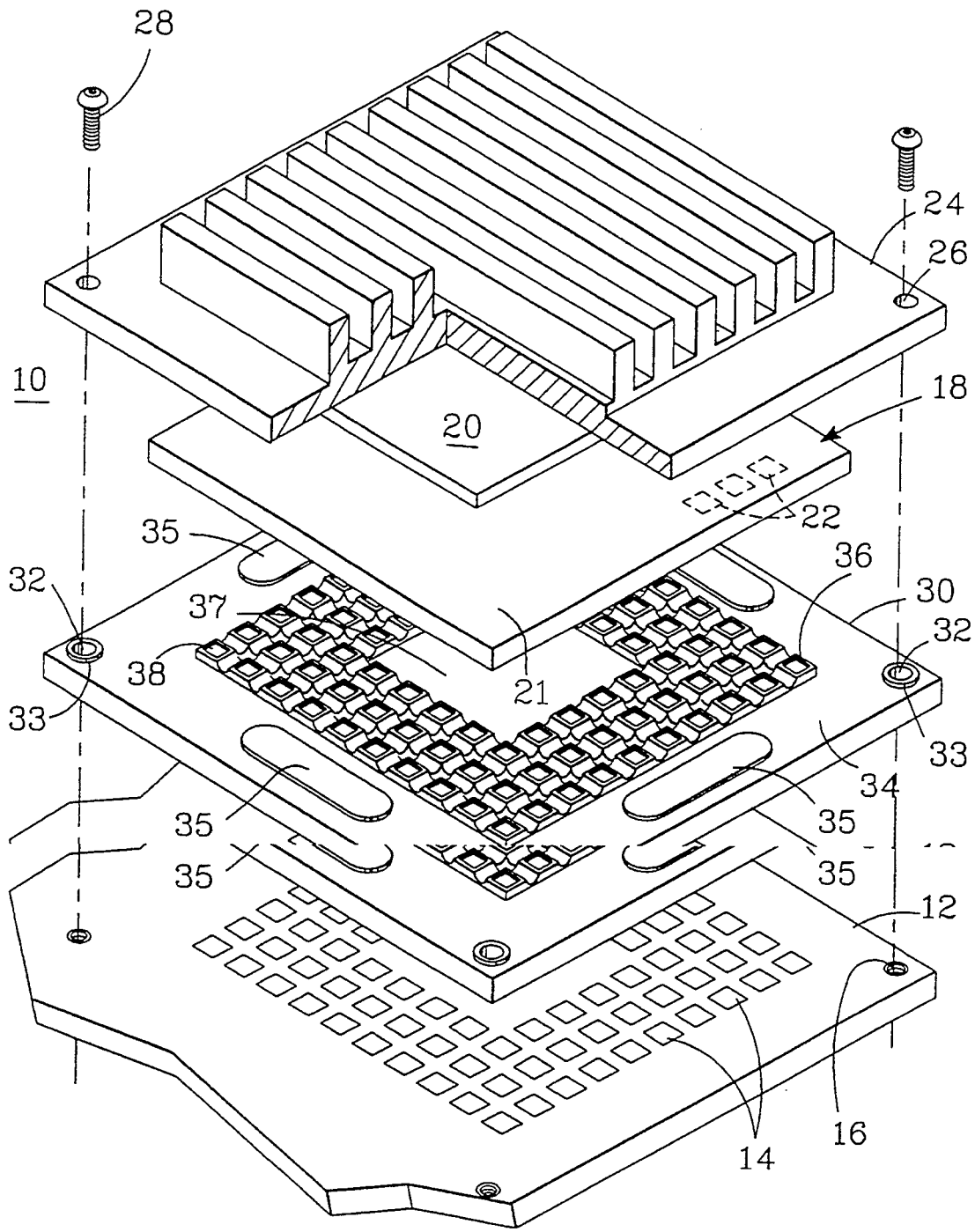

ELECTRICALLY CONDUCTIVE GEL

This application is a continuation of application Ser. No. 07/902,255 filed Jun. 22, 1992, now abandoned

BACKGROUND OF THE INVENTION

This invention is directed to an electrically conductive silicone gel containing conductive particles of silver, preferably in flake form, and silver coated mica. The invention has particular utility for the electrical interconnection of a plurality of conductors, such as discrete insulated wires, printed circuit board traces, conductors on a flat panel display, or pin grid array.

The prior art is replete with reference to the use of such materials as conductive epoxies and thermoplastic adhesives in devices to establish interconnections for electrical circuitry. For example, conductive epoxies have been employed to mount electrical components on printed circuit boards. Polymeric electrically conductive adhesives have also been employed in tape form to interconnect conductors on a substrate with other components or circuitry. When used to establish such electrical interconnections, these conductive epoxies and conductive adhesives can be deposited on a surface in a conventional manner, such as by screen printing. Then upon the application of heat and pressure or upon the application of pressure, depending upon the precise character of the conductive adhesive, both electrical and structural or mechanical integrity can be established between separate conductors. These conductive epoxies can be formulated to harden to form a mechanical connection, or they can have a tacky, putty-like consistency when cured. Although conductors can be removed from the putty-like material, the tacky material will adhere to the conductors upon removal.

These polymeric interconnection systems generally are intended to replace such conventional interconnections as soldered interconnections. However, these polymeric electrically conductive materials generally form permanent bonds between the conductors in somewhat the same manner as with the use of solder. Although polymeric conductive materials, unlike solder, do permit initial checking for electrical integrity prior to establishment of the final soldered interconnection, in use such conductive polymers establish a permanent interconnection between associated conductors.

U.S. Pat. No. 4,770,641, to Rowlette, represents an early commercial development of an electrically conductive gel. An attribute of such gel is its ability to be disconnected. The gel thereof comprises a polymeric conductor system in which a plurality of conductive particles are dispersed within an insulative gel-like medium. The conductive gel possesses a memory and is conformable to the cavity prior to interconnection of the associated conductors. The gel is not in a liquid state and is sufficiently coherent and viscous that it will not flow from the cavity means under the influence of gravity. The gel will also conform to the interface between the housing cavity and the conductors upon interconnection. Upon disconnection, however, the gel will return substantially to its original shape and remain within the housing cavities. The gel will not adhere to the conductors upon disconnection.

U.S. Pat. No. 4,406,827, to Carim, represents a different approach to an electrical conductive gel. The gel, developed for low resistance contact between a metal electrode and a biological body, comprises an aqueous solution of up to saturated concentrations of ionized salts as the conducting agent, a natural gum capable of crosslinking, and crosslinking material which provides the electrically conductive gel with sufficient internal strength to remain cohesive without reinforcement.

U.S. Pat. No. 4,845,457, to Nakanishi, is directed to a deformable variable resistor which employs a gelled silicone resin. The gel is characterized as having a defined penetration value as a basic member in which electrically conductive fine particles as much as 20 to 50 weight percent are mixed, which basic member is provided with at least a pair of electrodes so that the conductive fine particles contained in the basic member come in contact each other to form a number of electrical passages between the pair of electrodes when the basic member is physically deformed by an external force.

The present invention possesses the attributes of the prior art while avoiding the shortcomings or limitations thereof. The gel according to this invention is non-flowing, self healing, and thermally stable. That is, the silver flake and silver coated mica loaded gel is highly conductive over a range of temperatures. Further, by the unique combination of such silver flakes and silver coated mica the particles remain uniformly dispersed within the gel prior to curing of the gel. This assures a highly and uniformly electrically conductive gel. The various and numerous features of the gel according to this invention will become apparent in the description which follows.

SUMMARY OF THE INVENTION

This invention is directed to an electrically conductive silicone gel having a combination of conductive particles comprising silver coated mica and oxide free silver flakes uniformly dispersed therethrough, where said gel is characterized as non-flowing, self-healing, and thermally stable, with a preferred volume resistivity of less than about 2.0 milliohm-cm. A preferred basic gel is a cross-linked polysiloxane polymer.

BRIEF DESCRIPTION OF THE DRAWING

The FIGURE is an exploded, perspective view of an exemplary electrical interconnection system for utilizing the gel of this invention.

DETAILED DESCRIPTION OF PREFERRED EMBODIMENT

The present invention relates to an improved electrically conductive silicone gel containing conductive particles of silver flakes and silver coated mica, where the conductive gel, in a cured state, exhibits such attributes as high electrical conductivity, dispensability, and improved sealability against diffusion of deleterious environmental gases, such as sulfur.

A preferred formulation for the gel consists of the following ingredients:

| Wgt. Percent | Parts by Wgt. |            |
|---|---|---|
| 27.755 | 10.00 | polymer (1) |
| 1.387 | 0.50 | activator polymer (2) |
| .361 | 0.13 | Catalyst (3) |
| 46.07 | 16.60 | silver flakes |
| 24.424 | 8.80 | silver coated mica |
| 100% | 36.03 | total parts by weight |

The major gel ingredients are the polymer base and the activator polymer, where such ingredients exhibit structural formulas, as follows:

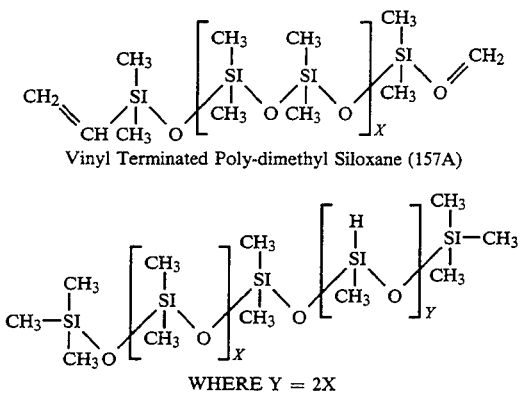

Vinyl Terminated Poly-dimethyl Siloxane (157A)

WHERE Y = 2X

The final fractional ingredient forming the basic gel is a catalyst, the structural formula of which is as follows:

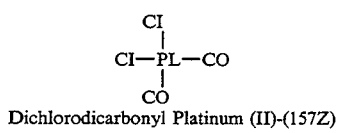

Dichlorodicarbonyl Platinum (II)-(157Z)

It was discovered during the development of this improved silicone gel that the combination of silver flakes and silver coated mica unexpectedly yielded a gel that retained its high electrical conductivity over a range of temperature and time. Through experimentation, it appeared that the silver flakes, typically in the 15 micron size range, with a density of about 10.5 gm/cm$^3$, compared to the basic gel of 1.0 gm/cm$^3$, would fall or segregate within the basic gel prior to curing. The silver coated mica, having a screened size of less than about 44 microns, would rise or float as a result of its low density of about 4.5 to 6.8 gm/cm$^3$, depending on the silver content.

While difficulties were noted with the separate use of such conductive particles, it was found that the combination, when present in a total amount of from 60–75%, by weight, and a preferred ratio of about 2 to 1, silver flakes to silver coated mica, avoided such difficulties. That is, the particles appear to work together to maintain a condition of equilibrium. In such a state the gel can be cured, as hereinafter described, to produce a uniform dispersion within the gel.

While finding the relationship of the silver flakes and silver coated mica to be a significant step forward, further work was required on the condition of the silver flakes. Typically such flakes, as purchased, are covered with organo metallic salts. It was determined that such salts were unstable at temperatures in excess of about 80° F., and that they interfered with full cross-linking of the polymer gel. Accordingly, a removal of the salts was required. In accordance with this invention, the silver flakes are pre-washed in an alcohol-ketone solution, followed by etching in a hot 5% solution of oxalic acid under constant agitation. The flakes are then rinsed in deionized water and dried under a vacuum at 120° C. The results are unoxidized and surface roughened silver flakes. It is believed that by the use of such etched silver flakes, better particle contact, i.e. silver to silver, silver to mica, is achieved. In fact, when a gel was prepared with non-etched silver flakes, and cured, it was found that after deformation, as hereinafter discussed, there was a loss of electrical conductivity, probably through a reduction in particle contact.

Returning to the formulated gel, with conductive particles, the formulated gel was mixed in a closed polyethylene container in a helium atmosphere at 350 RPM for a period of 2.5 minutes. The helium atmosphere prevents air entrainment and oxidation of the silver flake which decreases electrical conductivity in the cured gel. The final mixture has a creamy consistency and is dispensable. The viscosity is approximately 400,000 cps as measured by Brookfield RV viscometer using a spindle #7 at 4 RPM. The gel chemically cross-links in about 6 hours at 25° C. However, chemical cross-linking can be accelerated to 15 minutes at 175° C. in an air circulating convention oven.

The following diagram depicts the polymerization reaction:

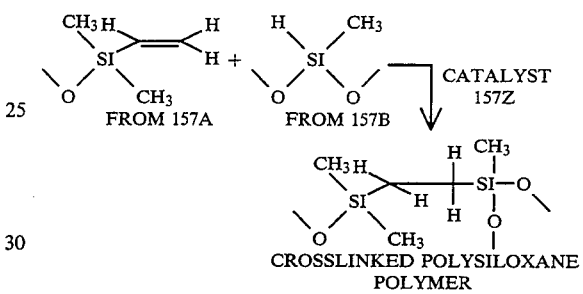

CROSSLINKED POLYSILOXANE POLYMER

In this reaction a vinyl terminated poly-dimethyl siloxane is cross-linked with a very flexible cross-linker in which X and Y are in a ratio of 1:2, respectively, which in turn are mediated by a dichlorodicarbonyl platinum (II) catalyst.

The FIGURE represents an exemplary embodiment of an electrical interconnection system utilizing the silver/silver mica cross-linked polysiloxane polymer according to this invention. Such embodiment, as more fully described in U.S. Pat. No. 5,037,312, to Casciotti et al., relates to an electrical connector for interconnecting multiple conductive paths in an area array which employs a conductive gel held in an elastomeric material body. The connector assembly 10, shown in an exploded perspective view in the FIGURE, includes a printed circuit board 12, representing a multi-layer printed circuit board typical of use in complex electronic circuits, a conductive, elastomeric grid array 30, a chip carrier 18 and a heat sink 24. These elements in use are fitted together and held together by virtue of fasting means passed through apertures on the edges of the elements and clamped by fasteners such as 28 shown in the FIGURE. The multilayer board 12 includes a series of conductive pads 14 extending on the upper surface thereof in arrays on given centers and interconnected to conductive layers within the body of 12 to interconnect to further components to form useful functions. The chip carrier 18 includes in the center thereof a large scale integrated circuit mounted on a substrate such as a ceramic or plastic substrate 21 having an array of conductive pads on the bottom surface thereof several such pads shown in phantom as 22 in the FIGURE. The various circuits within 20 are interconnected by traces not shown to the various pads 22. The heat sink 24 operates to conduct heat from the circuit chip 20 and dissipate such through fins on the upper surface thereof.

The pads 22 of the chip carrier 18 are on centers correspondingly to the centers of pads 14 on the board 12 and are typically plated to provide an oxide-free surface. Between the chip carrier 18 and the board 12 is the grid array connector 30 formed of an elastomeric material, and containing plural cavities 38 for receiving the silver/silver mica filled, cross-linked polysiloxane polymer of this invention. At the corners around the periphery of the body of the connector 30 are apertures 32 which correspond to apertures 16 of board 12 and 26 of the heat sink 24 and through which pass the fasteners 28 to lock the elements together and to board 12. The body of the connector, molded of elastomeric material, includes a series of rigid spacers such as 33 shown surrounding the apertures 32 and further spacers 35 embedded with the outer edges 34 of the connector. These spacers se precisely the spacing between the pads 22 of the chip carrier 18 and the pads 14 of board 12 by limiting the compression of the connector 30.

The Figure represents just one embodiment of an electrical interconnection device which can take advantage of the unique properties offered by the conductive gel of this invention.

I claim:

1. An electrically conductive silicone gel having a combination of conductive particles comprising silver coated mica and silver flakes uniformly dispersed therethrough, where said particles are present, by weight, in an amount between 60 and 75%, and gel is characterized as non-flowing, self-healing, and thermally stable, with a volume resistivity of less than about 2.0 milli-ohm-cm.

2. The electrically conductive silicone gel according to claim 1 wherein the ratio of silver flakes to silver coated mica is about 2:1.

3. The electrically conductive silicone gel according to claim 1 wherein said silicone gel is a crosslinked polysiloxane polymer.

4. The electrically conductive silicone gel according to claim 3 wherein said silicone gel is a vinyl terminated poly-dimethyl siloxane cross-linked with a flexible cross-linker, which has been mediated by a dichlorodicarbonyl platinum (II) catalyst.

5. The electrically conductive silicone gel according to claim 1 wherein said silver flakes are cleaned and etched prior to their dispersion within said gel.

6. The electrically conductive silicone gel according to claim 5 wherein said etched silver flakes exhibit a roughened surface to enhance the contact between adjacent silver flakes and silver coated mica.

7. The electrically conductive silicone gel according to claim 1 wherein said gel and conductive particles are mixed in an essentially air-free atmosphere.

* * * * *